(12) United States Patent
Okazaki et al.

(10) Patent No.: US 7,941,731 B2
(45) Date of Patent: May 10, 2011

(54) DATA SENDING DEVICE, DATA RECEIVING DEVICE, DATA SENDING METHOD, AND DATA RECEIVING METHOD

(75) Inventors: Takumi Okazaki, Tokyo (JP); Satoshi Nogaki, Tokyo (JP); Akira Kobayashi, Tokyo (JP); Yuzo Senda, Tokyo (JP)

(73) Assignee: NEC Corporation, Tokyo (JP)

( * ) Notice: Subject to any disclaimer, the term of this patent is extended or adjusted under 35 U.S.C. 154(b) by 1160 days.

(21) Appl. No.: 11/649,222

(22) Filed: Jan. 4, 2007

(65) Prior Publication Data
US 2007/0186142 A1  Aug. 9, 2007

(30) Foreign Application Priority Data

Feb. 7, 2006  (JP) .................. 2006-029774

(51) Int. Cl.
*H03M 13/00* (2006.01)

(52) U.S. Cl. .................. 714/774; 714/752; 714/764

(58) Field of Classification Search .................. 714/774, 714/752, 758, 761, 764, 799, 762
See application file for complete search history.

(56) References Cited

U.S. PATENT DOCUMENTS

| | | | | |
|---|---|---|---|---|
| 5,311,554 A | * | 5/1994 | Morera et al. | 375/316 |
| 5,617,083 A | * | 4/1997 | Schwendeman et al. | 340/7.43 |
| 5,926,434 A | | 7/1999 | Mori | |
| 2001/0002181 A1 | | 5/2001 | Kim et al. | |
| 2005/0002259 A1 | | 1/2005 | Suyama | |

FOREIGN PATENT DOCUMENTS

| | | |
|---|---|---|
| JP | 62-188443 | 8/1987 |
| JP | 03-092296 | 4/1991 |
| JP | 8-33069 | 2/1996 |
| JP | 9-298526 | 11/1997 |
| JP | 11-252054 | 9/1999 |
| JP | 2001-016584 | 1/2001 |
| JP | 2001-136150 | 5/2001 |
| JP | 2001-177459 | 6/2001 |
| JP | 2001-268019 | 9/2001 |
| JP | 2002-016577 | 1/2002 |
| JP | 2003-529951 | 10/2003 |
| JP | 2004-088246 | 3/2004 |
| JP | 2004-174703 | 6/2004 |
| JP | 2006-061902 | 3/2006 |

OTHER PUBLICATIONS

United Kingdom Patent Office issued an United Kingdom Office Action dated Feb. 19, 2009, Application No. GB0819936.6.
Japanese Patent Office issued a Japanese Office Action dated Nov. 17, 2009, Application No. 2006-029774.
Japanese Patent Office issued a Japanese Office Action dated Apr. 8, 2010, Application No. 2006-029774.

* cited by examiner

*Primary Examiner* — Fritz Alphonse
(74) *Attorney, Agent, or Firm* — Young & Thompson

(57) ABSTRACT

A data receiving device which comprises a decoder which generates a plurality of decoded data based on 1) input data and 2) a plurality of pairs of control data and redundant data, in each the pair, the control data defining a selected encoding process and the redundant data being generated by the selected encoding process based on the control data and the input data, a selection control part which generates an error occurrence information based on information obtained from a medium through which the input data is received, and a selection part which selects output data from the input data and the plurality of decoded data based on the error occurrence information.

20 Claims, 7 Drawing Sheets

DATA SENDING DEVICE, DATA RECEIVING DEVICE, DATA SENDING METHOD, AND DATA RECEIVING METHOD

BACKGROUND OF THE INVENTION

1. Field of the Invention

The present invention relates to a data sending device, a data receiving device, a data sending method, and a data receiving method, and more particularly to a data sending device, a data receiving device, a data sending method, and a data receiving method, which have error correction capabilities.

2. Description of the Related Art

It is generally inevitable that errors occur in a communications path and a recording medium. To correct errors, an error correction technique has been used in which redundant data are added to input data to be thereafter sent or recorded so that restoration may be performed in a receiving part when errors occur. With reference to FIG. 1, an information communications device having a conventional error correction function is described.

A redundant data generation part 21 generates redundant data from input data using a predetermined scheme and a control parameter, and supplies the redundant data thus generated to a multiplexing part 23.

The multiplexing part 23 sends the input data and the redundant data multiplexed to a communications path 3.

A demultiplexing part 43 receives the data and supplies the input data to a selection part 45, and supplies the input data and the redundant data to a decoding part 41.

The decoding part 41 performs error correction processes on the supplied input data and redundant data using the predetermined scheme and the control parameter, and supplies corrected data to the selection part 45.

An error detection part 49 detects occurrence of errors using communications information obtained from the communications path 3, and supplies information on the occurrence of errors to the selection part 45. Alternatively, it is possible that, in the decoding part 41, the occurrence of errors may be detected from the input data and the redundant data and information on the occurrence of errors is supplied to the selection part 45.

The above construction allows performing the correction process on errors that occur in the communications path 3.

However, in information communications devices having a conventional error correction function which is, for example, shown in Japanese Patent Application Laid-open No. Sho 62-188443, in Japanese Patent Application Laid-open No. Hei 8-033069, or in Japanese Patent Application Laid-open No. 2001-177459, a redundant data generation scheme and a control parameter are determined in advance. Accordingly, there has been a problem that differences and changes in characteristics of errors of a communications path and the error rate cannot be properly managed.

SUMMARY OF THE INVENTION

Therefore, an object of the present invention is to provide a data sending device and a data receiving device which are capable of properly coping with a difference in the characteristics of errors of a communications path and a change in the error rate.

Another object of the present invention is to provide a data sending method and a data receiving method which are capable of properly coping with a difference in the characteristics of errors of a communications path and a change in the error rate.

The present invention enables the use of a plurality of redundant data generation schemes and redundant data generation control parameters by statically or dynamically switching the same. Hence, it is possible to properly cope with a difference in the characteristics of errors of a communications path and a recording medium, and a change in the error rate.

The present invention is applicable to any type of data communications in general. For example, the present invention can be applied to distribution of images and bi-directional communications using IP (Internet Protocol).

According to the present invention, there provided a data receiving device comprising a decoder which generates a plurality of decoded data based on 1) input data and 2) a plurality of pairs of control data and redundant data, in each the pair, the control data defining a selected encoding process and the redundant data being generated by the selected encoding process based on the control data and the input data, a selection control part which generates an error occurrence information based on information obtained from a medium through which the input data is received, and a selection part which selects output data from the input data and the plurality of decoded data based on the error occurrence information.

According to the present invention, there provided a data transmission system comprising the data receiving device described above and a data sending device which sends the input data and the plural pairs of control data and redundant data to data receiving device.

According to the present invention, there provided a data receiving method comprising generating a plurality of decoded data based on 1) input data and 2) a plurality of pairs of control data and redundant data, in each pair, the control data defining a selected encoding process and the redundant data being generated by the selected encoding process based on the control data and the input data, generating an error occurrence information based on information obtained from a medium through which the input data is received, and selecting output data from the input data and the plurality of decoded data based on the error occurrence information.

According to the present invention, there provided a computer readable medium storing thereon a control program enabling a computer to execute a data receiving method comprising generating a plurality of decoded data based on 1) input data and 2) a plurality of pairs of control data and redundant data, in each pair, the control data defining a selected encoding process and the redundant data being generated by the selected encoding process based on the control data and the input data, generating an error occurrence information based on information obtained from a medium through which the input data is received, and selecting output data from the input data and the plurality of decoded data based on the error occurrence information.

DETAILED DESCRIPTION OF THE INVENTION

Figure 1:
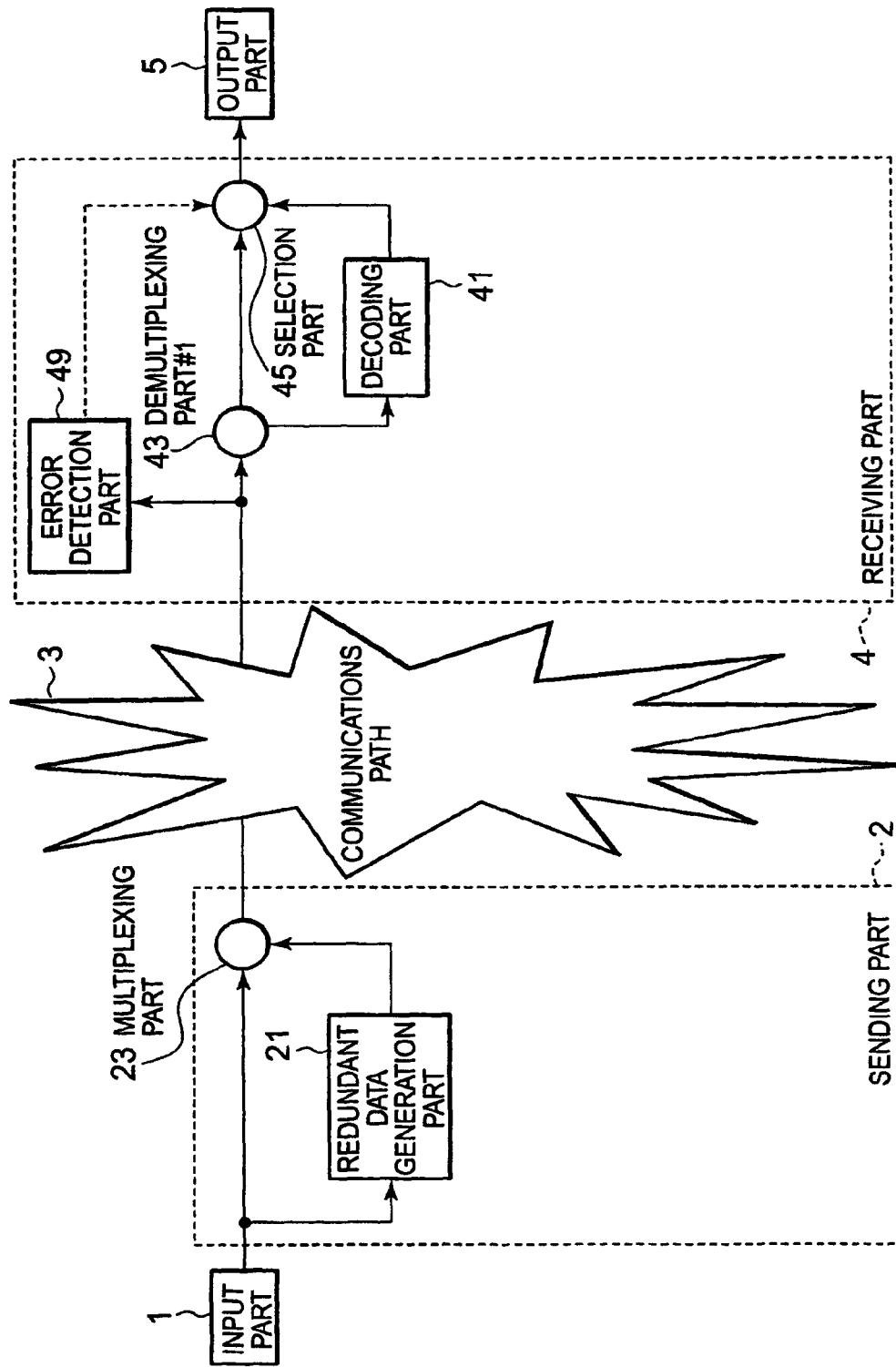
FIG. 1 is a block diagram showing a construction of a conventional data sending device and a conventional data receiving device.
Figure 2:
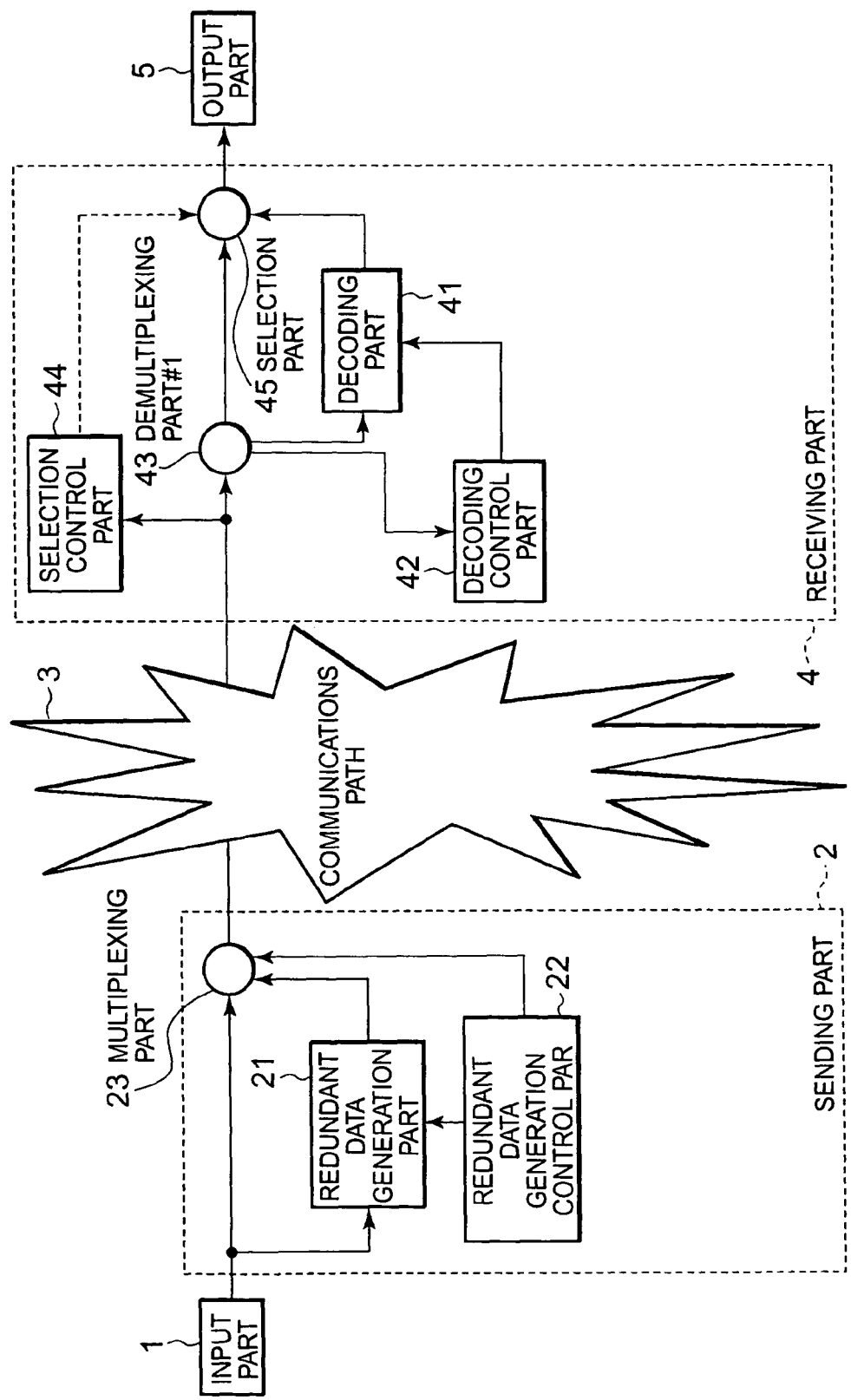
FIG. 2 is a block diagram showing a construction of a data sending device and a data receiving device of an embodiment of the present invention.

FIG. 2 is a block diagram showing an essential construction of the present invention, which includes an input part 1, a sending part 2, a communications path 3, a receiving part 4, and an output part 5.

The input part 1 sends input data to the sending part 2.

The sending part 2 is a part for performing communications having an error correction function. That is, the sending part 2 is a part which sends data from the input part 1 to the receiving part 4 through the communications path 3. The sending part 2 includes a redundant data generation part 21, a redundant data generation control part 22, and a multiplexing part 23.

The redundant data generation part 21 generates redundant data based on input data supplied from the input part 1 and control data supplied from the redundant data generation control part 22. Then, the redundant data generation part 21 supplies the redundant data thus generated to the multiplexing part 23.

The redundant data generation control part 22 determines a redundant data generation scheme to be used, by selecting from among one or a plurality of redundant data generation schemes, and also determines a control parameter for generating redundant data. The redundant data generation control part 22 supplies control data representing the redundant data generation scheme. Thus, the control parameter to the redundant data generation part 21 and the multiplexing part 23 is determined.

The multiplexing part 23 multiplexes the input data, the redundant data, and the control data, and sends the multiplexed data thus obtained to the receiving part 4 through the communications path 3.

The communications path 3 supplies the sent data supplied from the sending part 2 to the receiving part 4. The communications path 3 may be replaced by a recording medium or the like provided that the recording medium or the like fulfills the function described above.

The receiving part 4 is a part for receiving the sent data supplied from the communications path 3. The receiving part 4 includes a decoding part 41, a decoding control part 42, a demultiplexing part 43, a selection control part 44, and a selection part 45.

The decoding part 41 obtains from the decoding control part 42 a designation of a redundant data generation scheme and a redundant data generation control parameter. The decoding part 41 performs error correction processes on redundant data and input data supplied from the demultiplexing part 43 according to the redundant data generation scheme and the redundant data generation control parameter, and thus generates decoded data. Then, the decoding part 41 supplies the decoded data thus generated to the selection part 45.

The decoding control part 42 extracts the designation of the redundant data generation scheme and the redundant data generation control parameter from the supplied control data, and then supplies these extracted data to the decoding part 41.

The demultiplexing part 43 demultiplexes communications data, which is received from the communications path 3, into the input data, the redundant data, and the control data. Then the demultiplexing part 43 supplies the input data to the selection part 45; the redundant data and the input data to the decoding part 41; and supplies the control data to the decoding control part 42.

The selection control part 44 detects the occurrence of errors using communications information obtained from the communications path 3, and supplies the information on the occurrence of errors to the selection part 45.

Here, the selection control part 44 may use the same method as that used in the decoding part 41, in which the occurrence of errors is detected from input data and redundant data.

Alternatively, a method of detecting the occurrence of errors, which is different from that used in the decoding part 41, may be used. For example, it may be determined whether or not an error occurs at random or in a bursty manner, referring to a signal level of inputted data before digitization or an opening of an eye pattern thereof.

The selection part 45 selects either one of input data supplied from the demultiplexing part 43 or data after errors have been corrected (the data being supplied from the decoding part 41), according to the information on the occurrence of errors supplied from the selection control part 44. Then, the selected data are supplied to the output part 5.

For example, the selection control part 44 may cause the selection part 45 to select an output from the decoding part 41 if the error rate is within an error correction capability of the decoding part 41, and to select an output from the demultiplexing part 43 if the error rate is above the error correction capability of the decoding part 41. When the error rate is above the error correction capability of the decoding part 41, the receiving side may require the redundant data generation control part 22 on the sending side to increase the error correction capability of an error-correcting code generated by the redundant data generation part 21. On the other hand, when the present error correction capability is determined to be excessive, the receiving side may require the redundant data generation control part 22 on the sending side to decrease the error correction capability of an error-correcting code generated by the redundant data generation part 21. To decrease the error correction capability, for example, a transmission rate for an information part is increased. When a communications path can be monitored on the sending side, a change of the decoding scheme and the increase/decrease of redundancy may be controlled on the sending side. Such a control can also be applied to the following embodiment.

The output part 5 receives data supplied from the receiving part 4, and outputs the data as output data.

Next, respective parts in FIG. 2 are described in detail.

The redundant data generation control part 22 determines a redundant data generation scheme, selecting from one or a plurality of redundant data generation schemes, and also determines a control parameter for generating a redundant data. Then, the redundant data generation control part 22 supplies control data representing the redundant data generation scheme and the control parameter thus determined to the redundant data generation part 21 and the multiplexing part 23.

On the determining of a generation scheme and a control parameter, a static determination method can be used in which a generation scheme and a control parameter to be used are set in advance, depending on the characteristics of a communications path or a recording medium which is expected to be used. Alternatively, a method may be used in which, with reference to information such as a state of errors on a communications path, a generation scheme and a control parameter are dynamically changed, at a predetermined constant frequency or depending on the occurrence of events such as errors.

As control data, information showing the redundant data generation scheme and the control parameter determined above may be sent. Note that, when changing only the control parameter without changing the generation scheme, a method of only sending the control parameter may be adopted. In the same way, when switching only the generation scheme without changing the control parameter, a method of only sending the generation method may be adopted. Alternatively, by patterning combinations of generation schemes and control parameters, a method of only sending an identification of a pattern may be adopted.

The redundant data generation part 21 generates redundant data from input data according to the above described control data supplied from the redundant data generation control part 22, and sends the redundant data thus generated to the multiplexing part 23.

As schemes for a redundant data generation, error correction codes as typified by a simple parity code, a Reed-Solomon code, and Low Density Parity Check (LDPC) code and the like may be used. Furthermore, as control parameters, for example, parameters for such as redundancy, a block size, a frame size, and an interleave type may be determined such that they satisfy a necessary error correction capability. Details on schemes and operation methods are omitted here since they are well known by people skilled in the art.

The multiplexing part 23 converts the supplied input data, redundant data, and control data into predetermined formats to be thereafter multiplexed and sent.

A process of the above conversion converts data into a communications format, which is suitable for the communications path 3, a recording medium, or an application by, for example, adding headers and the like to the data. To control data, a predetermined form of presentation may be adopted. For example, a header form may be adopted in a fixed-length code or a variable-length code may be used.

Figure 3:
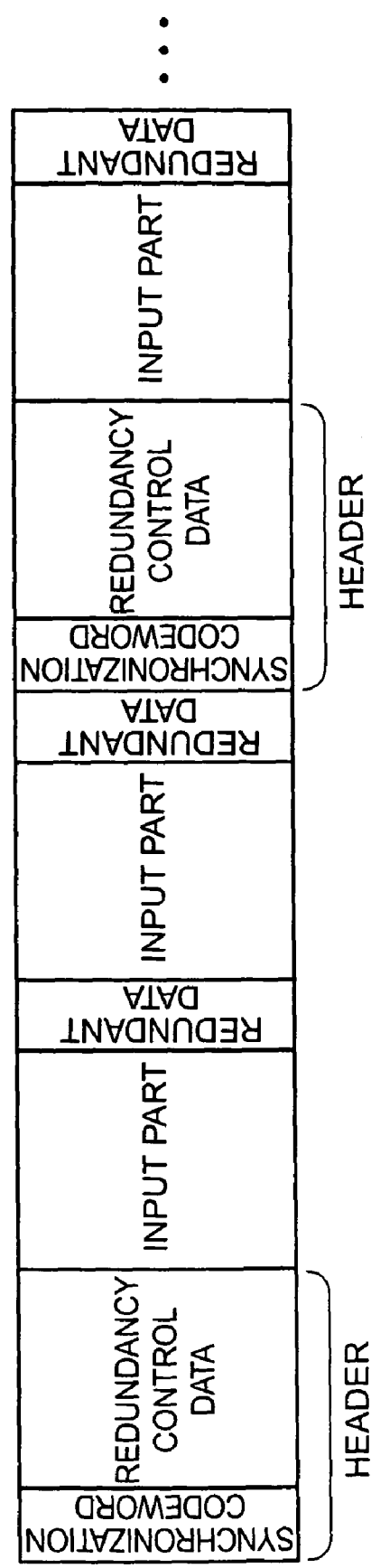
FIG. 3 is a view showing an example of a construction of data which are sent from the data sending device and then received by the data receiving device of the same.

An example of the format of communications data is shown in FIG. 3. In this example, a header is configured of a synchronization codeword showing a discontinuity of data, and redundancy control data. The format is described in the following, in which redundant data and input data are alternately inserted. Here, any method of inserting a header, input data, and redundant data may be employed. Note that, regarding the inserting of a header, a method in which a header is inserted only when a content of control data is replaced by another can be taken. Or other method can be taken in which a header is inserted in repetition regardless of whether or not a content of control data is changed. By use of the latter method, an effect is produced, in which an error correction can be correctly performed even when communications data are obtained from the middle thereof.

Note that, the redundant data generation control part 22 may perform a process for converting control data into those in a predetermined form of presentation (for example, a header form using a fixed-length code or a variable-length code), and the multiplexing part 23 may not convert the control data.

When changing only a control parameter without changing a generation scheme, the multiplexing part 23 may adopt a method of sending only the control parameters as control data. In the same way, when switching only a generation scheme without changing a control parameter, a method of sending only the information on the generation method may be adopted. Alternatively, by forming a table of combinations of generation schemes and control parameters, a method of sending only index information on the table may be adopted.

In this embodiment, although the communications path 3 is used to connect the sending part and the receiving part, the communications path 3 may be replaced by a recording medium.

The demultiplexing part 43 demultiplexes communications data into input data, redundant data, and control data, the communications data being received from the communications path 3. The demultiplexing part 43, then, supplies the input data to the selection part 45; the redundant data and the input data to the decoding part 41; and supplies the control data to the decoding control part 42.

The decoding control part 42 extracts from the supplied control data a designation of a redundant data generation scheme and a redundant data generation control parameter, and supplies these extracted information to the decoding part 41. When the sending part has sent only either one of the redundant data generation scheme and the redundant data control parameter, the decoding control part 42 may supply, if needed, information not having being sent from the sending part to the decoding part 41 for complement.

The decoding part 41 performs error correction processes on the redundant data and the input data according to the designation of the redundant data generation scheme and the redundant data generation control parameter, supplied from the decoding control part 42, and the decoding part 41 generates decoded data. The decoding part 41, then, supplies the generated decoded data to the selection part 45.

The selection control part 44 detects occurrence of errors using communications information obtained from the communications path 3, and supplies the information on the occurrence of errors to the selection part 45. Alternatively, the occurrence of errors may be detected in the decoding part 41 from the input data and the redundant data to be thereafter supplied to the selection control part 44.

The selection part 45 selects either one of input data supplied from the demultiplexing part 43 and data after errors have been corrected, which is supplied from the decoding part 41, according to the supplied information on the occurrence of errors, and then outputs data thus selected. Alternatively, correction information for correcting errors in the decoding part 41 may be outputted to the selection part 45, and decoding may be performed in the selection part 45.

As described above, in the present embodiment, a plurality of redundant data generation schemes and redundant data generation control parameters can be used by statically or dynamically switched from one to another, and differences and changes in the characteristics of errors of the communications path and the error rate can be properly managed.

The reason for the above is, for example, because the sending part 2 determines a redundant data generation scheme, selected from one or a plurality of redundant data generation schemes, and determines a control parameter for generating a redundant data generation as well, and then sends the determined information along with input data and redundant data to the receiving part 4. In addition, another reason is because, for example, when the sending part 2 sends redundant data which are generated with a plurality of kinds of redundant data generation schemes or control parameters, the sending part 2 can simultaneously send redundant data having a plurality of characteristics, the redundant data being capable of coping with errors with different characteristics.

Alternatively, in the example shown in FIG. 2, sent data, redundant data, and control data may be respectively sent using separate communications paths without providing the multiplexing part 23.

Note that decoding control part 42, decoding part 41 may be combined and constructed as one part, a decoder. A decoder also may include a multiplexing part 43.

Figure 4:
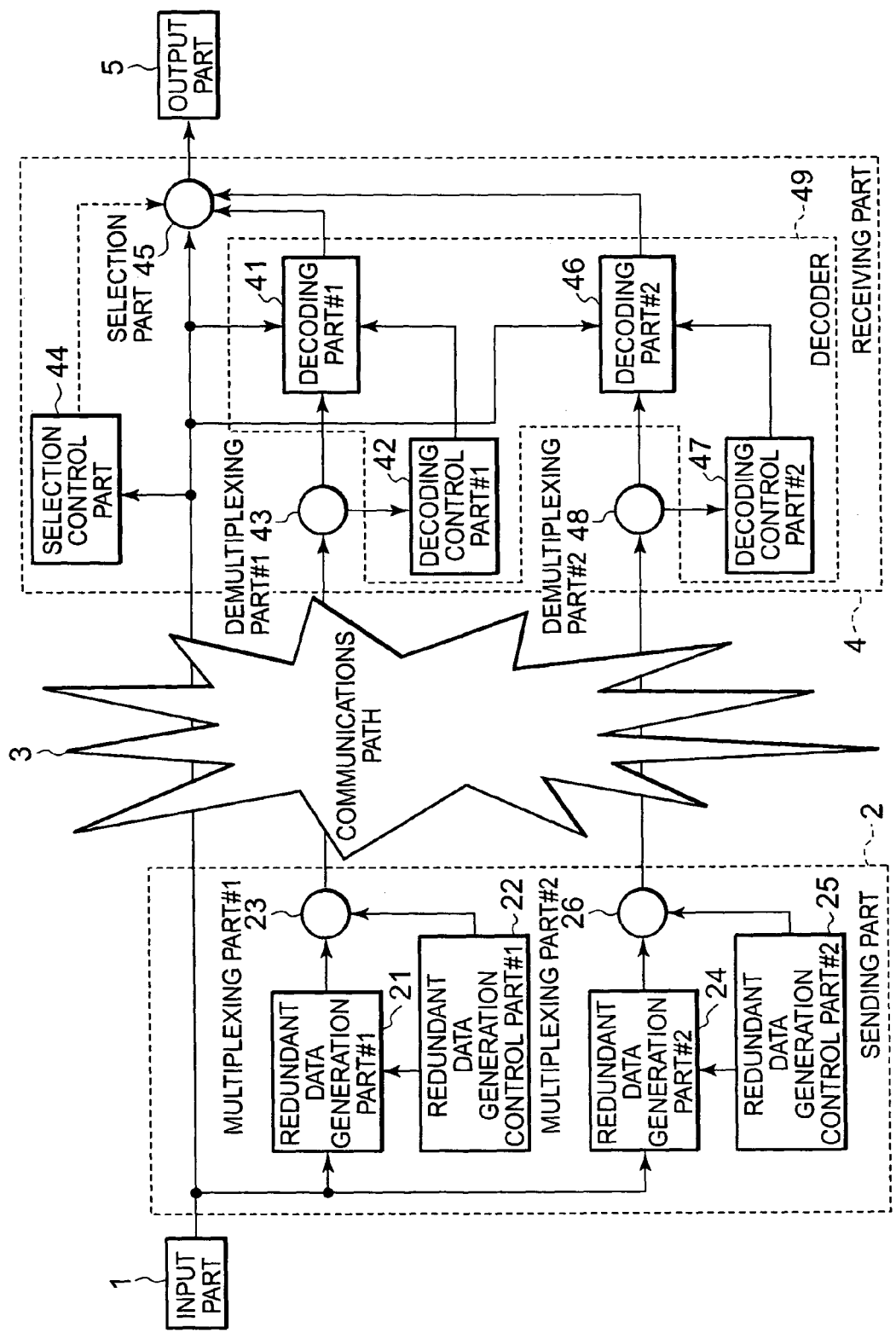
FIG. 4 is a block diagram showing a construction of a data sending device and a data receiving device of another embodiment of the present invention.

Another embodiment of the present invention is shown in FIG. 4. Although the fundamental construction of the embodiment is the same as above, a method of sending redundant data is further modified. In the embodiment of FIG. 4, from among a plurality of kinds of redundant data generation schemes and control parameters, two pairs, each of a redundant data generation scheme and a control parameter, are selected, and the control data and the redundant data are sent through connections which are different from one for input data. Although two pairs of redundant data are sent in the construction shown here, the present invention has no limitation to the number of the kinds thereof.

Input data from an input part 1 are sent as it is to a receiving part 4 through a communications path 3. Here, the communications path 3 may be replaced by a recording medium.

A redundant data generation control part #1 (22) determines a redundant data generation scheme, by selecting from one or a plurality of redundant data generation schemes, and also determines a control parameter for generating a redundant data. The redundant data generation control part #1 (22), then, sends control data representing the redundant data generation scheme and the control parameter thus determined to a redundant data generation part #1 (21) and a multiplexing part #1 (23).

The redundant data generation part #1 (21) generates redundant data from input data according to the supplied control data, and sends the redundant data thus generated to the multiplexing part #1 (23).

The multiplexing part #1 (23) multiplexes the supplied redundant data and the control data, and sends the multiplexed data to a communications path. The communications path used here is a different communication path or a different connection from the communications path used for the input data. This communications path may be replaced by a recording medium. A recording medium for recording input data and a recording medium for recording multiplexed data outputted from the multiplexing part #1 (23), may be the same as each other or may be different from each other.

A redundant data generation control part #2 (25), a redundant data generation part #2 (24), and a multiplexing part #2 (26) are, respectively, connected in the same constructions as those for the redundant data generation control part #1 (22), the redundant data generation part #1 (21), and the multiplexing part #1 (23), and operate in the same manner as the parts (22), (21), and (23). For each of the communication paths used here, a different communication path or a different connection from one for input data and one for the multiplexing part #1 (23), is used and may be replaced by a recording medium.

Figure 5:
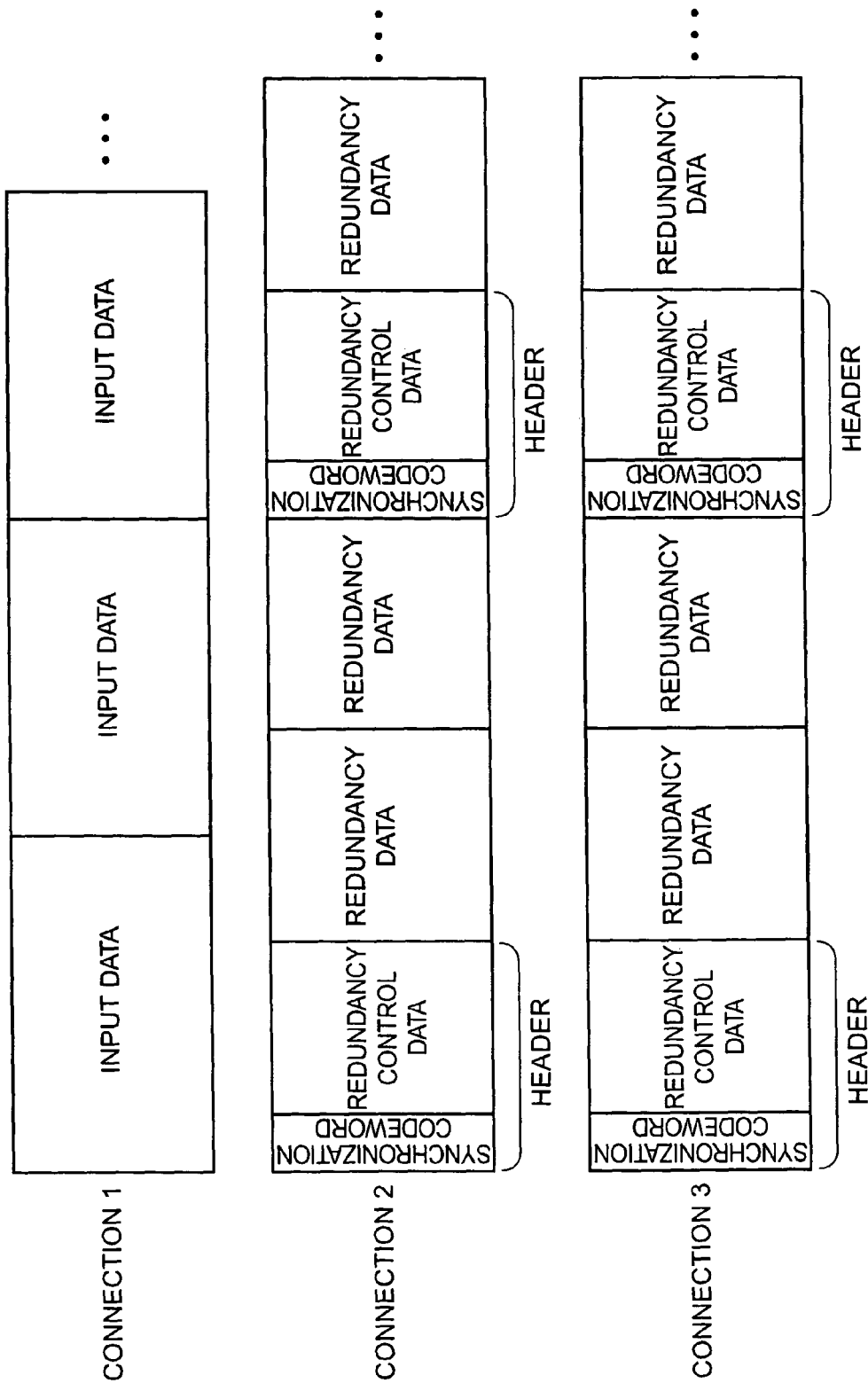
FIG. 5 is a view showing an example of a construction of data which are sent from the data sending device and then received by the data receiving device of the same.

FIG. 5 is a view showing examples of data formats to be communicated. In this example, a construction is adopted, in which input data are transmitted through a connection 1, while redundant control data and redundant data are sent through a connection 2 and a connection 3. In this case, for the connections 1, 2, and 3, by using lines and connections whose characteristics such as priority are different from each other, resistance to errors can be controlled.

A demultiplexing part #1 (43) demultiplexes the communications data, which is received from the communications path 3 or a recording medium, into the redundant data and the control data, and supplies the redundant data to a decoding part #1 (41), and the control data to a decoding control part #1 (42).

The decoding control part #1 (42) extracts the redundant data generation scheme and the redundant data generation control parameter from the supplied control data, and supplies these to the decoding part #1 (41).

The decoding part #1 (41) performs error correction processes on the redundant data and the input data according to the supplied input data, the redundant data generation scheme and the redundant data generation control parameter, and supplies decoded data to a selection part 45.

A demultiplexing part #2 (48), a decoding control part #2 (47), and a decoding part #2 (46) are respectively connected in the same constructions as those for the demultiplexing part #1 (43), the decoding control part #1 (42), and the decoding part #1 (41), and operate in the same manner as the parts (43), (42), and (41).

A selection control part 44 detects the occurrence of errors using communications information obtained from the communications path 3, and supplies the information on the occurrence of errors to a selection part 45. Alternatively, the occurrence of errors may be detected from the input data and redundant data in the decoding part #1 (41) and the decoding part #2 (46), and supplied to the selection control part 44.

The selection part 45 selects either input data or data after errors have been corrected, the data being supplied from the decoding part #1 (41) and/or the decoding part #2 (46) to be thereafter outputted.

As described above, in the present embodiment, since redundant data generated by using a plurality of kinds of redundant data generation schemes or control parameters are, separately, transmitted using separate lines or separate connections, an effect is obtained, in which redundant data, which have a plurality of characteristics capable of coping with errors having different characteristics from each other, can be sent. Furthermore, by using different lines and connections, whose characteristics such as priorities suitable for respective redundant data are different, an effect is produced, in which resistance characteristics to errors can be controlled.

In the present embodiment, the sending part 2 separately transmits input data, redundant data generated using a plurality of kinds of redundant data generation schemes or control parameters, and control data, by using separate lines or separate connections. Therefore, different lines and connections can be used, the lines and connections having characteristics such as priorities suitable for the amount of respective data and the characteristics thereof. Accordingly, control for properly coping with difference or change in error characteristics or error rates of the respective communication paths is achieved.

Note that, it is possible to combine the embodiment shown in FIG. 2 and the embodiment shown in FIG. 4. That is, it is possible that multiplexed data of input data, control data and redundant data are sent by using the construction of FIG. 2 while multiplexed data of another control data and another redundant data are sent by using a part of the construction of FIG. 4.

Note that decoding control part #1 (42) and decoding part #1 (41) may be combined and constructed as one part. Same is true for decoding control part #2 (47) and decoding part #2

(46). It is also possible to construct a single part, a decoder 49, with all the functions of decoding control part #1 (42) decoding part #1 (41) decoding control part #2 (47) and decoding part #2 (46). A decoder 48 may include the multiplexing part #1 (43) and multiplexing part #2 (48).

Next, a specific example of the construction of FIG. 4 is described.

For example, the redundant data generation part #1 (21), the redundant data generation control part #1 (22), the multiplexing part #1 (23), the decoding part #1 (41), the decoding control part #1 (42), and the demultiplexing part #1 (43), which are in the first line, are assumed to employ a codeword which is highly capable of correcting random errors, while the redundant data generation part #2 (24), the redundant data generation control part #2 (25), the multiplexing part #2 (26), the decoding part #2 (46), the decoding control part #2 (47), and the demultiplexing part #2 (48), which are in the second line, are assumed to employ a codeword which is highly capable of correcting burst errors.

The decoding part #1 (41) and the decoding part #2 (46) are constituted to cause error flags indicating that the decoding part #1 (41) and the decoding part #2 (46) have not been able to correct errors to be respectively outputted therefrom for every symbol (one unit of data).

The selection part 45 checks both error flags of the decoding part #1 (41) and the decoding part #2 (46) of each symbol.

When an error flag from only one of the decoding parts shows that there is an error, the selection part 45 selects a symbol from the other decoding part.

When error flags from both decoding parts show the presence of errors, the selection part 45 outputs a symbol from any one of the decoding parts, or an invalid value to the output part 5, and simultaneously outputs to the output part 5 a flag showing that an error of the symbol has not been able to be corrected.

When error flags from both decoding parts show that there is no error, the selection part 45 outputs a symbol from any one of the decoding parts to the output part 5. However, when the values of symbols from both decoding parts are compared with each other and when the values are same with each other, that value is outputted to the output part 5. When the values are not same with each other, the following process may be performed.

Provided that the line #1 is for handling a codeword which is strong against random errors and that the line #2 is for handling a codeword which is strong against burst errors when the kind of errors indicated by the selection control part 44 is shown to be a random error, a symbol from the decoding part #1 (41) may be selected, and when the kind of errors is shown to be a burst error, a symbol from the decoding part #2 (46) may be selected.

In addition, another example may be given to have the following construction and operations.

That is, although FIG. 4 shows only two lines, three lines of redundant data generation parts, redundant data generation control parts, multiplexing parts, decoding parts, decoding control parts, and demultiplexing parts are provided.

Figure 6:
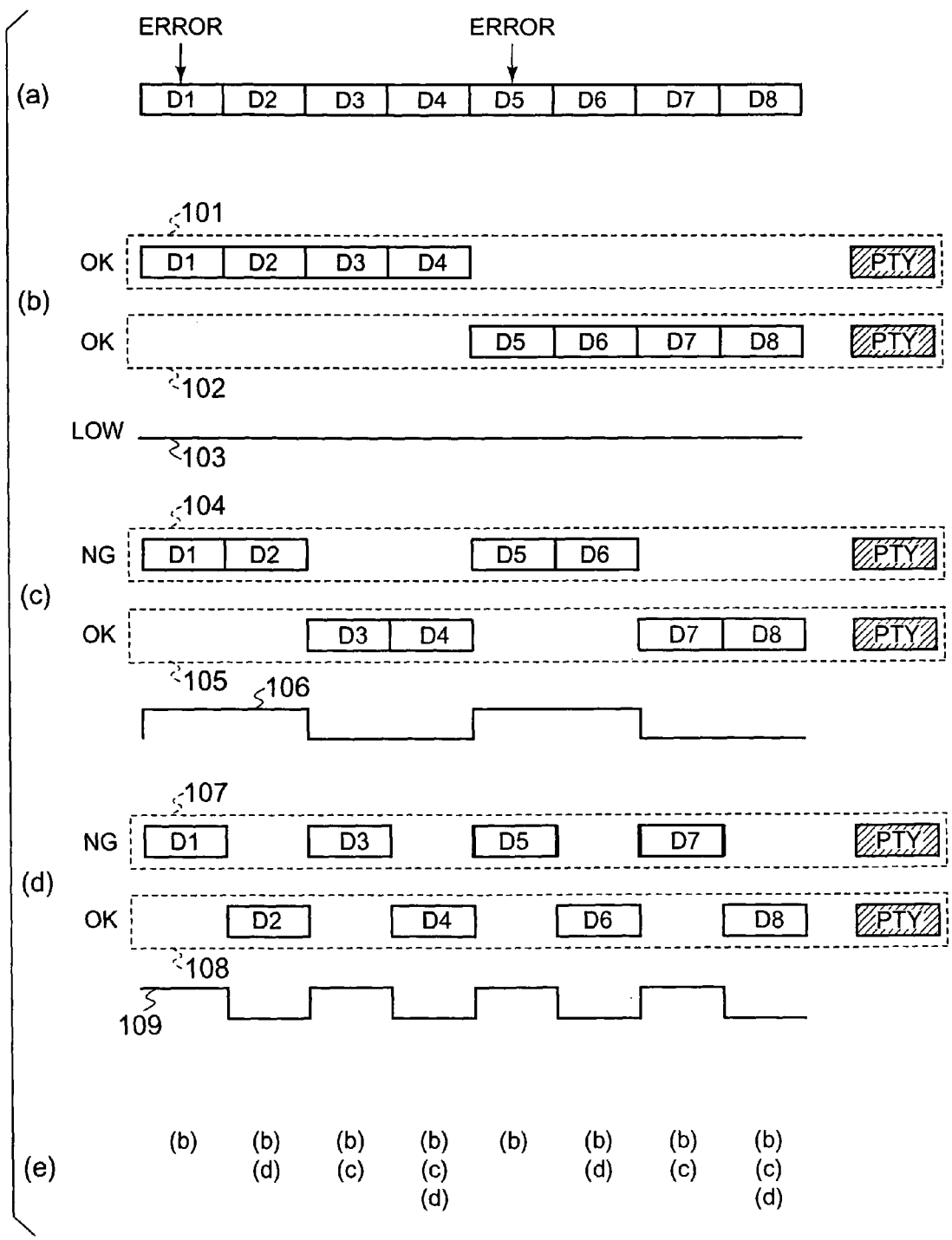
FIG. 6 is a view showing a state of error corrections of the same.

In a first line, a sequence of codewords shown in FIG. 6(b) is assumed to be handled; in a second line, a sequence of codewords shown in FIG. 6(c) is assumed to be handled; and, in a third line, a sequence of codewords shown in FIG. 6(d) is handled. Although each of FIGS. 6(b), (c), and (d) shows codewords which have a capability of correcting one symbol error by adding one parity to four symbols, patterns for the positions of symbols represented by each codeword are different from one another.

In the sequence shown in FIG. 6(b), one parity symbol is added to four consecutive symbols. In the sequence shown in FIG. 6(c), one parity symbol is added to two sets of two consecutive symbols, in between each of the set, two other symbols are sandwiched. In the sequence shown in FIG. 6(d), one parity symbol is added to four consecutive symbols which are odd numbered, and another one parity symbol is added to four consecutive symbols which are even numbered.

Assuming errors occur in the symbols D1 and D5 as shown in FIG. 6(a), in the case of the sequence of FIG. 6(b), the errors can be corrected along with codewords indicated by a code 101 and codewords indicated by a code 102. Accordingly, as shown by a code 103 (LOW), no error is shown by error flags for the symbols D1 to D8.

In the case of the sequence of FIG. 6(c), codewords shown in a code 104 are incapable of correcting errors, and codewords shown in a code 105 are capable of correcting errors. Accordingly, as shown by a code 106, error flags for the symbols D1, D2, D5, and D6 show that there are errors, while error flags for the symbols D3, D4, D7, and D8 show that there is no error.

In the sequence of FIG. 6(d), codewords shown in a code 107 are incapable of correcting errors, and codewords shown in a code 108 are capable of correcting errors. Accordingly, as shown by a code 109, error flags for the symbols D1, D3, D5, and D7 show that there are errors (HIGH), while error flags for the symbols D2, D4, D6, and D8 show that there is no error (LOW).

As a result, with respect to respective symbols, sequences in which error flags show that there is no error (LOW) are as shown in FIG. 6(e). That is, with respect to the symbols D1 and D5, the sequence (a first sequence) of FIG. 6(b) is only one, in which an error flag shows that there is no error. Hence, the selection part 45 selects symbols in the first sequence.

As shown in FIG. 6(e), with respect to the symbols D2 and D6, sequences in which error flags show no error are the sequence (the first sequence) of FIG. 6(b) and the sequence (a third sequence) of FIG. 6(d). Accordingly, the selection part 45 selects symbols in the first sequence or symbols in the third sequence. Although any one of the above may be selected, as described above, symbols in a sequence which has lesser possibility of having errors may be selected with reference to information from the selection control part 44 and error flags of anterior and posterior symbols.

With respect to the symbols D3 and D7, sequences in which error flags show that there is no error are the sequence (the first sequence) of FIG. 6(b) and the sequence (the second sequence) of FIG. 6(c). Accordingly, the selection part 45 selects symbols in the first sequence or symbols in the second sequence. Although any one of the above may be selected, as described above, symbols in a sequence which has lesser possibility of having errors may be selected with reference to information from the selection control part 44 and error flags of anterior and posterior symbols.

With respect to the symbols D4 and D8, a sequence in which error flags show no error are the sequence (the first sequence) of FIG. 6(b), the sequence (the second sequence) of FIG. 6(c), and the sequence (a third sequence) of FIG. 6(d). Accordingly, the selection part 45 selects symbols in the first sequence, symbols in the second sequence, or symbols in the third sequence. Although any one of the above may be selected, as described above, symbols in a sequence which has lesser possibility of having errors may be selected with reference to information from the selection control part 44 and error flags of anterior and posterior symbols.

In addition, as shown in FIG. 4, data to be multiplexed may be selected from among send data, redundant data, and control data of each sequence, while arbitrary combination of send data, redundant data, and control data of each sequence may be multiplexed.

Figure 7:
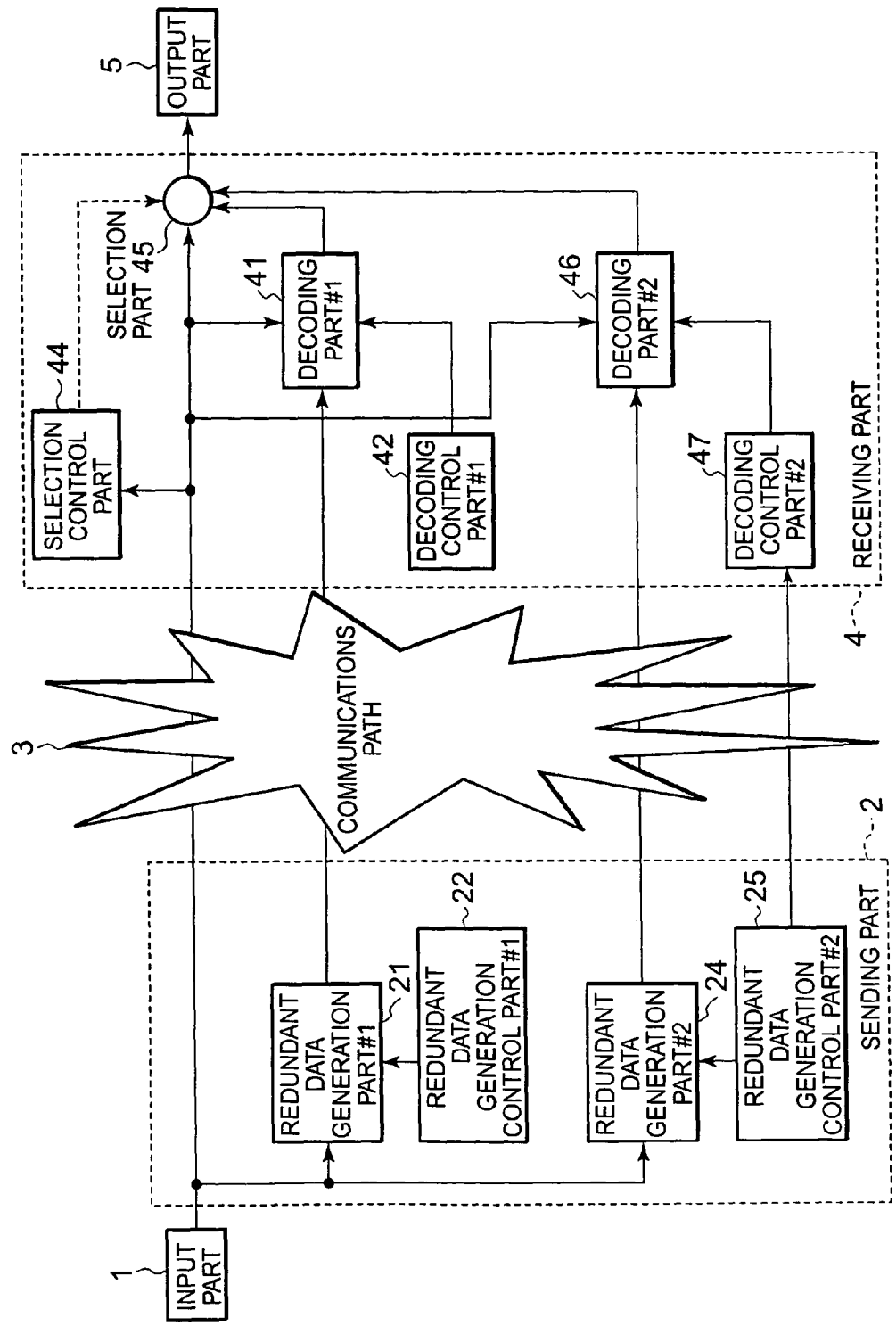
FIG. 7 is a block diagram showing a construction of a data sending device and a data receiving device of yet another embodiment of the present invention.

Furthermore, yet another embodiment of the present invention is shown in FIG. 7. Although the fundamental construction of the embodiment is the same as that of the above, a method of sending redundant data is different from that of the above. In the construction of the embodiment shown in FIG. 7, from among a plurality of kinds of redundancy schemes and control parameters, two pairs are selected; and redundant control data, redundant data, and input data are, respectively, transmitted through different connections.

Input data from an input part 1 is sent as it is to a receiving part 4 through a communications path 3. Here, the communications path 3 may be replaced by a recording medium.

A redundant data generation control part #1 (22) determines a single redundant data generation scheme to be used, by selecting from one or a plurality of redundant data generation schemes, and also determines a control parameter for generating a redundant data. The redundant data generation control part #1 (22) then supplies control data representing the redundant data generation scheme and the control parameter thus determined to a redundant data generation part #1 (21), and sends the same to a decoding control part #1 through the communications path 3. This communications path 3 may be replaced by a recording medium.

The redundant data generation part #1 (21) generates redundant data from the input data according to the supplied control data, and sends the redundant data to a decoding part #1 through the communications path 3. This communications path 3 may be replaced by a recording medium.

A redundant data generation control part #2 (25) and a redundant data generation part #2 (24) are connected, respectively, in the same construction as those for the redundant data generation control part #1 (22) and the redundant data generation part #1 (21), and operate in the same manner as the parts (22) and (21). Communications paths or connections used here may be different paths or connections different from those used for the input part 1, the redundant data generation control part #1 (22), and the redundant data generation part #1 (21). In the same manner, this communications part may be replaced by a recording medium.

A decoding control part #1 (42) extracts the redundant data generation scheme and the redundant data generation control parameter from the supplied control data, and sends these extracted information to a decoding part #1 (41).

The decoding part #1 (41) performs error corrections on the redundant data and the input data according to the supplied redundant data generation scheme and the redundant data generation control parameter, and supplies decoded data to a selection part 45.

A decoding control part #2 (47) and a decoding part #2 (46) are assumed to be, respectively, connected in the same constructions as those of the decoding control part #1 (42) and the decoding part #1 (41), and operate in the same manner as the parts (42) and (41).

A selection control part 44 detects the occurrence of errors by using communications information obtained from the communications path 3, and supply information on the occurrence of errors to a selection part 45. Alternatively, in the decoding part #1 (41) and the decoding part #2 (46), the occurrence of errors may be detected from the input data and the redundant data thereafter supplied to the selection control part 44.

The selection part 45 selects and thus outputs, according to the supplied information on the occurrence of errors, input data or data after errors have been corrected, which are supplied from the decoding part #1 (41) and/or the decoding part #2 (46).

As described above, in the present embodiment, input data, redundant data generated using a plurality of kinds of redundant data generation schemes or control parameters, and control data are respectively transmitted through separate lines or separate connections. Thus, by using lines and connections having different characteristics such as priorities from each other, an effect is produced, in which resistance characteristics to errors can be more closely controlled.

Moreover, when a LDPC scheme is used as an encoding scheme, calculation coefficients themselves may be sent as control data. Instead, when a rule for generating calculation coefficients is predetermined on both sending and receiving sides, parameters for obtaining calculation coefficients according to the rule may be sent. In the case of a LDPC scheme, by using some part of calculation coefficient, redundant data can be generated. Accordingly, as data shared by a plurality of pairs of redundant data generation parts and decoding parts, a calculation coefficient is transmitted; and those (all of or some of parts of calculation coefficient), which are to be used, among the calculation coefficient may be set to be different for respective pairs for each other. All of the calculation coefficients, which are possibly to be used between the sending and receiving sides, may be determined in advance, and parameters for designating calculation coefficients, which are actually to be used for respective pairs, may be transmitted.

Moreover, the data sending devices and data receiving devices shown in FIGS. 2, 4, and 7 can be achieved by using hardware and software, or by combinations thereof.

Note that a program stored in an unillustrated record medium, such as ROM (read only memory), may cause an unillustrated computer to execute the operation of each of sending part 2 or receiving part 4 above.

What is claimed is:

1. A data receiving device comprising:
a decoder which generates a plurality of decoded data based on 1) input data and 2) a plurality of pairs of control data and redundant data, in each said pair, said control data defining a selected encoding process and said redundant data being generated by said selected encoding process based on said control data and said input data,
a selection control part which generates an error occurrence information based on information obtained from a medium through which said input data is received, and
a selection part which selects output data from said input data and said plurality of decoded data based on said error occurrence information.

2. The data receiving device according to claim 1, wherein at least one of said plurality of pairs of control data defines an encoding process detecting random errors and another of said plurality of pairs of control data defines an encoding process useful in detecting burst errors, and
said selection part selects said output data depending on a characteristic of errors indicated in said error occurrence information.

3. A data transmission system comprising:
the data receiving device according to claim 2 and
a data sending device which sends said input data and said plurality pairs of control data and redundant data to data receiving device.

4. The data receiving device according to claim 1, wherein said selection part selects said output data from one of said input data and said plurality of decoded data.

5. A data transmission system comprising:
the data receiving device according to claim 4 and
a data sending device which sends said input data and said plurality pairs of control data and redundant data to data receiving device.

6. The data receiving device according to claim 1, wherein said selection part selects said output data by combining plural parts from a plurality of sources selected from said input data and said plurality of decoded data.

7. A data transmission system comprising:
the data receiving device according to claim 6 and
a data sending device which sends said input data and said plurality pairs of control data and redundant data to data receiving device.

8. The data receiving device according to claim 1, wherein said data receiving device requires a data sending device, from which said plurality sets of control data and redundant data are received, to change said encoding process.

9. A data transmission system comprising:
the data receiving device according to claim 8 and
a data sending device which sends said input data and said plurality pairs of control data and redundant data to data receiving device.

10. The data receiving device according to claim 1, wherein each of said input data, said plurality of pairs of control data and said redundant data is received from separate media, said media comprising at least one of a communication path and a recording medium.

11. A data transmission system comprising:
the data receiving device according to claim 10 and a data sending device which sends said input data and said plurality pairs of control data and redundant data to data receiving device.

12. A data transmission system comprising:
the data receiving device according to claim 1 and
a data sending device which sends said input data and said plural pairs of control data and redundant data to data receiving device.

13. A data receiving method comprising:
generating via programmed computer a plurality of decoded data based on 1) input data and 2) a plurality of pairs of control data and redundant data, in each pair, said control data defining a selected encoding process and said redundant data being generated by said selected encoding process based on said control data and said input data,
generating via a programmed computer an error occurrence information based on information obtained from a medium through which said input data is received, and
selecting via a programmed computer output data from said input data and said plurality of decoded data based on said error occurrence information.

14. The data receiving method according to claim 13, wherein at least one of said plurality of control data defines an encoding process useful in detecting random errors and at least another one defines encoding process useful in detecting burst errors, and
selecting said output data depending on a characteristic of errors indicated in said error occurrence information.

15. The data receiving method according to claim 13, wherein the selecting-step comprises selecting said output data from one of said input data and said plurality of decoded data.

16. The data receiving method according to claim 13, wherein the selecting step comprises selecting said output data by combining plural parts selected from a plurality of sources selected from said input data and said plurality of decoded data.

17. The data receiving method according to claim 13, further comprising:
requiring a data sending device, from which said plurality sets of control data and redundant data are received, to change said encoding process.

18. The data receiving method according to claim 13, wherein each of said input data and said plurality of pair of control data and redundant data is received from separate said media, said media comprising at least one of a communication path and a recording medium.

19. A non-transitory computer readable medium storing thereon a control program enabling a computer to execute a data receiving method comprising:
generating a plurality of decoded data based on 1) input data and 2) a plurality of pairs of control data and redundant data, in each pair, said control data defining a selected encoding process and said redundant data being generated by said selected encoding process based on said control data and said input data,
generating an error occurrence information based on information obtained from a medium through which said input data is received, and
selecting output data from said input data and said plurality of decoded data based on said error occurrence information.

20. The non-transitory computer readable medium according to claim 19, wherein at least one of said plurality of control data defines an encoding process useful in detecting random errors and at least another one defines encoding process useful in detecting burst errors, and
selecting said output data depending on a characteristic of errors indicated in said error occurrence information.

* * * * *